United States Patent
Auger

(10) Patent No.: US 9,222,967 B2
(45) Date of Patent: Dec. 29, 2015

(54) SECURED DETECTION SYSTEM

(71) Applicant: Schneider Electric Industries SAS, Rueil Malmaison (FR)

(72) Inventor: Marc Auger, Soyaux (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 461 days.

(21) Appl. No.: 13/865,779

(22) Filed: Apr. 18, 2013

(65) Prior Publication Data
US 2013/0282311 A1    Oct. 24, 2013

(30) Foreign Application Priority Data

Apr. 18, 2012    (FR) .................................... 12 53581

(51) Int. Cl.
| | |
|---|---|
| G08B 21/00 | (2006.01) |
| G01R 31/28 | (2006.01) |
| G05B 9/02 | (2006.01) |
| H01H 47/00 | (2006.01) |

(52) U.S. Cl.
CPC .............. *G01R 31/2834* (2013.01); *G05B 9/02* (2013.01); *H01H 47/005* (2013.01)

(58) Field of Classification Search
USPC ............................. 340/518, 540, 505; 702/58
See application file for complete search history.

(56) References Cited

U.S. PATENT DOCUMENTS

| | | | |
|---|---|---|---|
| 4,290,055 A * | 9/1981 | Furney ................. | G08B 26/005 340/505 |
| 8,902,063 B2 * | 12/2014 | Auger ..................... | G05B 9/02 340/540 |

FOREIGN PATENT DOCUMENTS

| | | |
|---|---|---|
| DE | 199 35 639 | 5/2000 |
| EP | 0 874 437 A2 | 10/1998 |
| FR | 2 631 138 | 11/1989 |
| WO | WO 92/07374 | 4/1992 |

OTHER PUBLICATIONS

French Search Report issued in French Application No. 1253581 on Nov. 7, 2012.
U.S. Appl. No. 13/890,764, filed May 9, 2013, Auger, et al.

\* cited by examiner

*Primary Examiner* — Lam Nguyen
(74) *Attorney, Agent, or Firm* — Oblon, McClelland, Maier & Neustadt, L.L.P.

(57) ABSTRACT

The invention relates to a detection system employed for securing a start-up of an application, said system comprising at least one first detector (D2) and one second detector (D3), each detector comprising two input terminals (I1, I2) connected to its logic inputs, two output terminals (O1, O2) connected to its logic outputs and two power supply terminals (0V, +24V) connected to two electrical power supply lines. The two output terminals (O1, O2) of the first detector (D2) are connected to the two input terminals (I1, I2) of the second detector (D3) and the two output terminals (O1, O2) of the second detector (D3) are connected to control devices (K1, K2) of the application to be secured, so as to form a detection chain.

20 Claims, 3 Drawing Sheets

SECURED DETECTION SYSTEM

TECHNICAL FIELD OF THE INVENTION

The present invention relates to a secured detection system.

PRIOR ART

In order to secure the access to a machine M situated in premises, it is known practice to provide a secure detection system which makes it possible to disallow the start-up of the machine when the means of access to the premises is open. Since one and the same premises may contain several access means, at least one detector is provided to secure each means of access. In this situation, the detectors are wired in a chain so that the output terminals of a first detector are connected to the input terminals of a second detector, and so on. Thus the start-up of the machine will be possible only when all the outputs of the detectors are active, that is to say when all the means of access to the premises are closed. In the current secured detection systems, an additional security module MS is connected to the output terminals of the last detector of the chain and to means for starting up the machine. FIG. 2 represents a chained structure according to the prior art. In this FIG. 2, interconnection devices are employed for connecting the detectors D1', D2', D3' together. At the end of the chain, the security module MS is connected to the output terminals of the last detector D3'. Two control relays K1, K2 of the machine and a feedback loop comprising a start-up button B-St are connected to the additional security module MS.

In the prior art, each detector is in automatic start-up mode by design. The additional security module is therefore obligatory for managing the manual start-up of the machine. This additional security module does indeed provide the choice between several modes for starting up the machine but it increases the cost of the detection system and the response time of the system.

The object of the invention is to propose a detection system that comprises several detectors wired in a chain and that does not require the use of an additional security module.

DESCRIPTION OF THE INVENTION

This is object is achieved by a detection system employed for securing a start-up of an application, said system comprising:

at least one first detector and one second detector, each detector comprising two input terminals connected to its logic inputs, two output terminals connected to its logic outputs and two power supply terminals connected to two electrical power supply lines, the two output terminals of the first detector being connected to the two input terminals of the second detector, the system being characterized in that:

the two output terminals of the second detector are connected to control devices of the application to be secured, so as to form a detection chain, the second detector comprises a start-up input terminal and a test output terminal, to the second detector, a feedback loop is connected between the start-up input terminal and the test output terminal, for the purpose of monitoring the control devices, the first detector is configured in an automatic start-up mode, the second detector is configured in a manual start-up mode, which is conditional upon an active state of the inputs of the second detector, and on a closed feedback loop.

According to the invention, the first detector and the second detector are identical.

According to another particular feature, the first detector also comprises a start-up input terminal connected to a positive potential power supply line and an unconnected test output terminal.

According to the invention, the detectors are of the radio-identification type or of the Hall-effect type.

According to another particular feature, the feedback loop is controlled by a start-up button.

According to the invention, the system comprises a first interconnection device and a second interconnection device connected to the first interconnection device, the first detector being connected to the first interconnection device and the second detector to the second interconnection device.

According to another particular feature of the invention, the control devices are connected to the second interconnection device.

BRIEF DESCRIPTION OF THE FIGURES

Other features and advantages will become evident in the following detailed description made with respect to the appended drawings in which.

DETAILED DESCRIPTION OF AT LEAST ONE EMBODIMENT

Figure 1:
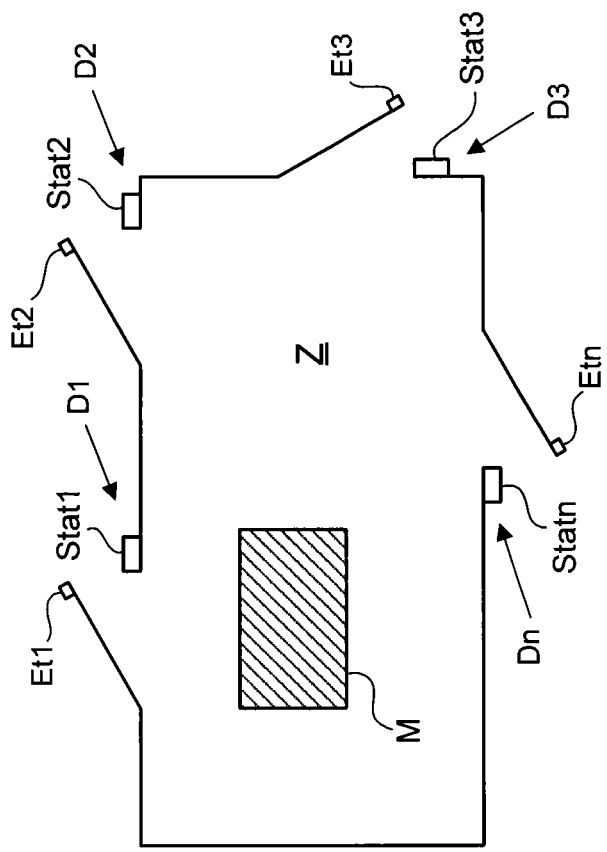
FIG. 1 illustrates the context of use of a secured detection system.

The invention relates to a secured detection system. Such a secured detection system is for example employed for securing the start-up of an application, for example of a machine, situated in premises Z. FIG. 1 illustrates this example. The secured detection system comprises several detectors D1, D2, D3, ... Dn connected in a chain, each detector being devoted to the supervision of a means of access to the premises Z. The start-up of the machine M is possible only if all the outputs of the detectors are active, that is to say when all the means of access to the premises are closed.

The detectors are for example of the radio-identification type (hereinafter called RFID). Naturally, technologies other than RFID could be employed, such as for example detection by Hall effect, optical or with magnetic contacts. The rest of the description will concentrate on detectors of the RFID type.

In the context illustrated by FIG. 1, an RFID electronic tag Et1, Et2, Et3 is for example attached to the means of access, while a read/write station Stat1, Stat2, Stat3 is attached to the frame of the means of access. When the RFID electronic tag Et1, Et2, Et3 is in the field of the station, it means that the means of access is closed and therefore that the outputs of the detector are active.

As discussed above, in the prior art shown in FIG. 2, an additional security module MS is connected at the end of the chain. This additional security module MS manages the start-up mode of the machine M and monitors the feedback loop Br, that is to say the state of the control relays K1, K2 of the machine. The object of the invention is to remove this additional security module from the detection chain.

Figure 3:
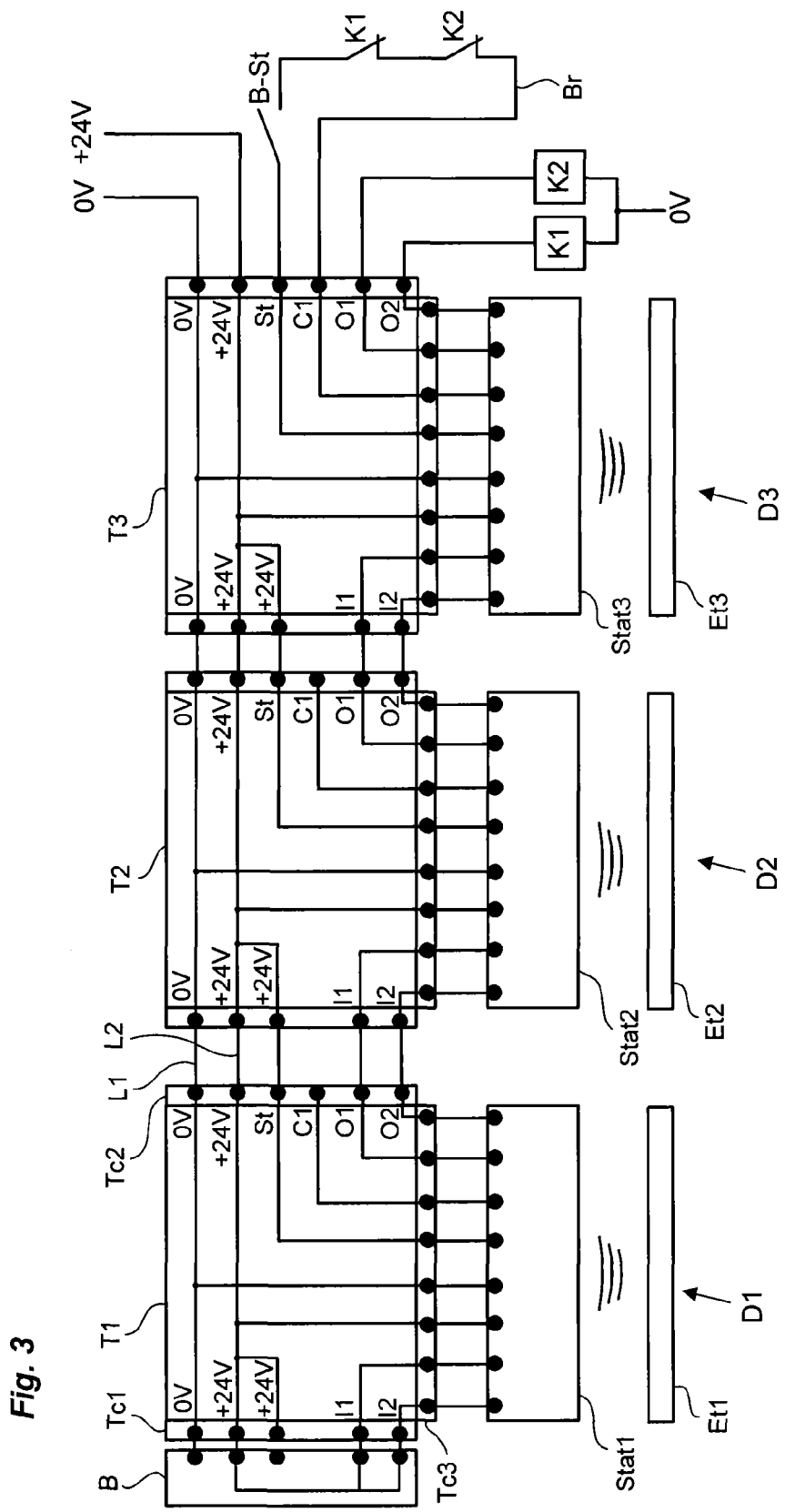
FIG. 3 represents the secured detection system of the invention.

In the rest of the description, consideration will be given to a detection chain that comprises a number n of detectors, n being greater than or equal to two. The detector of rank n is situated at the end of the detection chain. In FIG. 3, only three detectors D1, D2, D3 are shown.

According to the invention, each detector comprises two input terminals I1, I2 connected to its logic inputs, two output terminals O1, O2 connected to its logic outputs, two power supply terminals (0V, +24V), a start-up input terminal St and a test output terminal C1.

In the secured detection system, the output terminals O1, O2 of the detector of rank 1 are connected to the input terminals I1, I2 of the detector of rank 2, the output terminals O1, O2 of the detector of rank 2 are connected to the input terminals I1, I2 of the detector of rank 3 and so on. The output terminals O1, O2 of the detector of rank n−1 are therefore connected to the input terminals of the detector of rank n.

The two power supply terminals (0V, +24V) of each detector of the chain are connected to two power supply lines extending over the whole length of the chain and connected to a power supply source. The first power supply line L1 is at a zero electrical potential and the second power supply line L2 is at a positive electrical potential, for example set at +24 Volts.

According to the invention, the detectors of rank 1 to n−1 are configured in automatic start-up mode, that is to say that the activation of their outputs is not conditional upon the manual closure of a loop connected to their start-up input terminal St. To configure these detectors in automatic start-up mode, their start-up input terminal St is connected to the second power supply line L2. The chaining of the detectors produces this configuration. In this automatic start-up mode, the RFID tag of each detector must be within the range of the reader in order to activate the logic outputs.

According to the invention, the output terminals O1, O2 of the detector of rank n are connected to control devices of the machine M, consisting of two relays K1, K2.

The feedback loop Br, used to monitor the state of the two relays K1, K2, is connected between the start-up input terminal St and the test output terminal C1 of the detector of rank n. The start-up button of the machine is placed on this feedback loop Br. The start-up of the machine M is carried out by pressing the start-up button and is possible only if the outputs of the detector of rank n are active and if the feedback loop Br is closed.

According to the invention, in order to carry out the wiring between two detectors of the chain, two T-shaped interconnection devices are used for example. FIG. 3 shows such a solution. One interconnection device is associated with each detector of the chain. Thus, the detection system also comprises n identical interconnection devices. Naturally, it would be possible to dispense with the interconnection devices by incorporating into each detector the wiring configuration produced by each of the interconnection devices.

The interconnection devices T1, T2, T3 are arranged to ensure the continuity of the power supply lines L1, L2, connect the output terminals O1, O2 of a detector to the input terminals I1, I2 of the next detector and allow the detectors of ranks 1 to n−1 to operate in automatic start-up mode by connecting their start-up input terminal St to the second power supply line L2. The feedback loop Br controlled by the start-up button B-St is connected between the start-up input terminal St and the test output terminal C1 of the detector of rank n, via the interconnection device of rank n.

Each interconnection device T1, T2, T3 comprises an upstream connector Tc1, a downstream connector Tc2 and an intermediate connector Tc3. The detector is connected to the intermediate connector of the interconnection device, while the connector downstream of an interconnection device of rank 1 is connected to the connector upstream of the interconnection device of rank 2 and so on to rank n.

Moreover, a start-of-chain plug is for example positioned on the interconnection device of rank 1. This plug B is used to connect the input terminals I1, I2 of the detector of rank 1 to the second power supply line L2, which automatically attaches the physical inputs to the positive electrical potential. In this state, the inputs are called active.

Naturally, five-wire cables are employed to produce the junction between the interconnection devices.

In operation, if all the means of access are closed, the outputs of the detectors of ranks 1 to n−1 are active and the inputs of the detector of rank n, situated at the end of the chain, are then active. The outputs of the detector of rank n will be active if the feedback loop Br is closed, that is to say if the two monitoring relays K1, K2 are closed, if the RFID tag is within the range of the reader and if the start-up button B-St has been engaged.

The secured detection system of the invention therefore has several advantages as listed below:

- It makes it possible to avoid the use of an additional security module, while retaining the manual start-up mode and the monitoring of the feedback loop Br.
- Each detector can operate in automatic start-up mode or in manual start-up mode. The configuration of each detector is carried out transparently for the user, simply by wiring of the detectors.
- All the detectors of the system are identical irrespective of their position in the chain.
- Depending on the wiring configuration of the detector, the detection system of the invention can be imagined with or without interconnection device.

Figure 2:
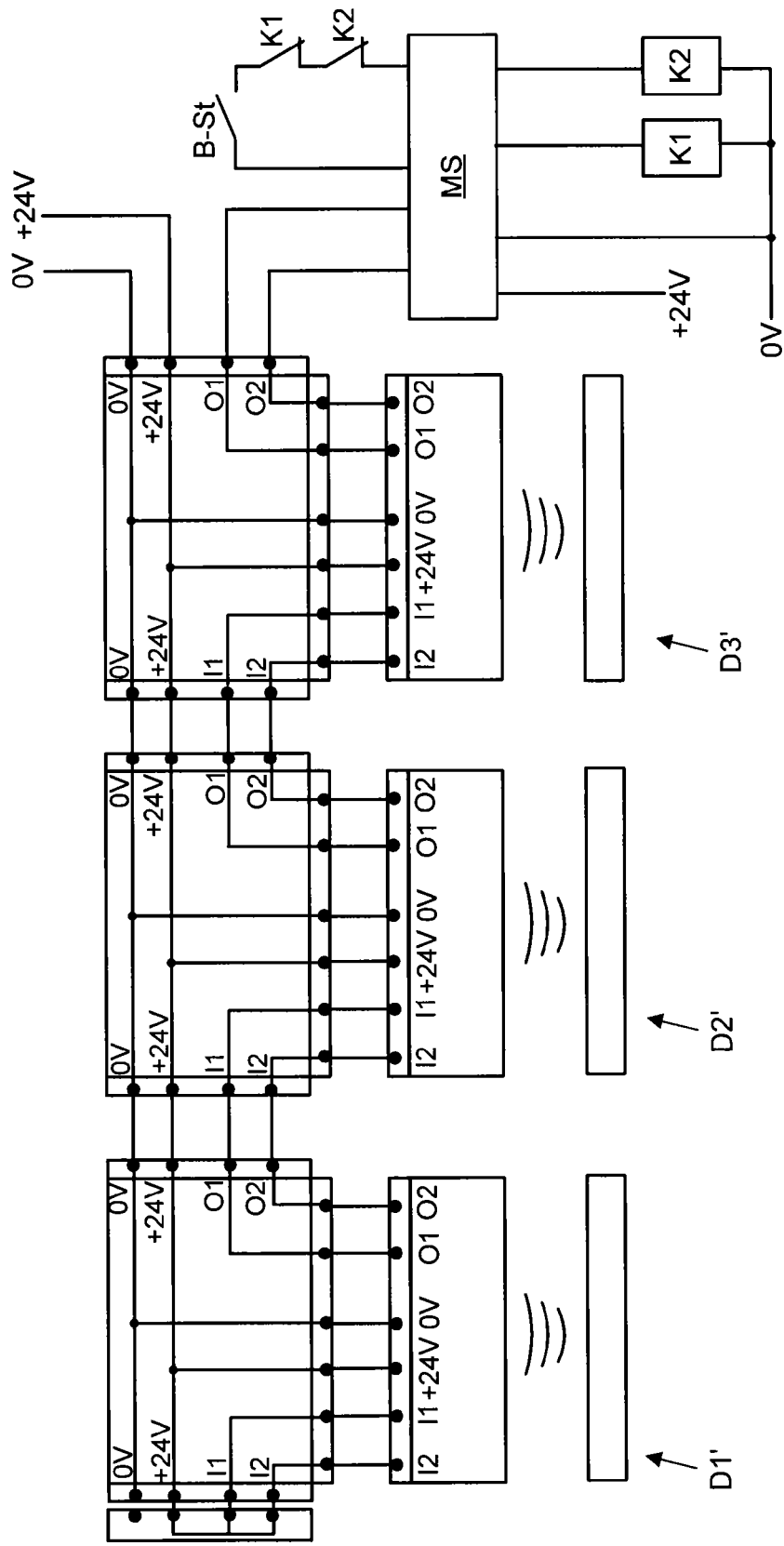
FIG. 2 represents a secured detection system according to the prior art.

According to the invention, in order to propose additional start-up modes and/or additional switching capabilities, it is possible to employ an additional security module MS like the one shown in FIG. 2. The security model MS would then be connected to the two outputs of the detector of rank n situated at the end of the chain, for example via an interconnection device. The detector of rank n would then be configured in automatic start-up mode. The security module would manage the feedback loop and the activation of the control relays K1, K2.

The invention claimed is:

1. Detection system employed for securing a start-up of an application, said system comprising:
    at least one first detector (D2) and one second detector (D3), each detector comprising two input terminals (I1, I2) connected to its logic inputs, two output terminals (O1, O2) connected to its logic outputs and two power supply terminals (0V, +24V) connected to two electrical power supply lines, the two output terminals (O1, O2) of the first detector (D2) being connected to the two input terminals (I1, I2) of the second detector (D3), characterized in that:
    the two output terminals (O1, O2) of the second detector (D3) are connected to control devices (K1, K2) of the application to be secured, so as to form a detection chain,
    the second detector (D3) comprises a start-up input terminal (St) and a test output terminal (C1), to the second detector (D3), a feedback loop (Br) is connected between the start-up input terminal (St) and the test output terminal (C1), for the purpose of monitoring the control devices, the first detector (D2) is configured in an automatic start-up mode, the second detector (D3) is configured in a manual start-up mode, which is conditional upon an active state of the inputs of the second detector (D3), and on a closed feedback loop (Br).

2. System according to claim 1, characterized in that the first detector (D2) and the second detector (D3) are identical.

3. System according to claim 2, characterized in that the first detector also comprises a start-up input terminal (St) connected to a positive potential power supply line (L2) and an unconnected test output terminal.

4. The system according to claim 3, characterized in that the detectors are of the radio-identification type.

5. The system according to claim 3, characterized in that the detectors are of the Hall-effect type.

6. The system according to claim 3, characterized in that the feedback loop (Br) is controlled by a start-up button (B-St).

7. The system according to claim 3, characterized in that it comprises a first interconnection device (T2) and a second interconnection device (T3) connected to the first interconnection device (T2), the first detector (D2) being connected to the first interconnection device (T2) and the second detector (D3) to the second interconnection device (T3).

8. The system according to claim 2, characterized in that the detectors are of the radio-identification type.

9. The system according to claim 2, characterized in that the detectors are of the Hall-effect type.

10. The system according to claim 2, characterized in that the feedback loop (Br) is controlled by a start-up button (B-St).

11. The system according to claim 2, characterized in that it comprises a first interconnection device (T2) and a second interconnection device (T3) connected to the first interconnection device (T2), the first detector (D2) being connected to the first interconnection device (T2) and the second detector (D3) to the second interconnection device (T3).

12. System according to claim 1, characterized in that the detectors are of the radio-identification type.

13. The system according to claim 12, characterized in that the feedback loop (Br) is controlled by a start-up button (B-St).

14. The system according to claim 12, characterized in that it comprises a first interconnection device (T2) and a second interconnection device (T3) connected to the first interconnection device (T2), the first detector (D2) being connected to the first interconnection device (T2) and the second detector (D3) to the second interconnection device (T3).

15. System according to claim 1, characterized in that the detectors are of the Hall-effect type.

16. The system according to claim 15, characterized in that the feedback loop (Br) is controlled by a start-up button (B-St).

17. The system according to claim 15, characterized in that it comprises a first interconnection device (T2) and a second interconnection device (T3) connected to the first interconnection device (T2), the first detector (D2) being connected to the first interconnection device (T2) and the second detector (D3) to the second interconnection device (T3).

18. System according to claim 1, characterized in that the feedback loop (Br) is controlled by a start-up button (B-St).

19. System according to claim 1, characterized in that it comprises a first interconnection device (T2) and a second interconnection device (T3) connected to the first interconnection device (T2), the first detector (D2) being connected to the first interconnection device (T2) and the second detector (D3) to the second interconnection device (T3).

20. System according to claim 19, characterized in that the control devices (K1, K2) are connected to the second interconnection device (T3).

* * * * *